(12) United States Patent
Gadkaree et al.

(10) Patent No.: US 8,530,998 B2
(45) Date of Patent: Sep. 10, 2013

(54) SUBSTRATE COMPOSITIONS AND METHODS FOR FORMING SEMICONDUCTOR ON INSULATOR DEVICES

(75) Inventors: Kishor Purushottam Gadkaree, Painted Post, NY (US); Matthew John Dejneka, Corning, NY (US); Adam James Ellison, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 570 days.

(21) Appl. No.: 12/682,842

(22) PCT Filed: Oct. 28, 2008

(86) PCT No.: PCT/US2008/012192
§ 371 (c)(1),
(2), (4) Date: Apr. 13, 2010

(87) PCT Pub. No.: WO2009/058245
PCT Pub. Date: May 7, 2009

(65) Prior Publication Data
US 2010/0224954 A1 Sep. 9, 2010

Related U.S. Application Data

(60) Provisional application No. 61/001,180, filed on Oct. 31, 2007.

(51) Int. Cl.
*H01L 29/02* (2006.01)

(52) U.S. Cl.
USPC ............ 257/506; 257/347; 257/E21.561; 257/E21.568; 257/E29.002; 438/458; 438/426; 438/432

(58) Field of Classification Search
USPC .......... 257/506, E29.002, E21.568; 438/458
See application file for complete search history.

(56) References Cited

U.S. PATENT DOCUMENTS

| | | | |
|---|---|---|---|
| 5,831,309 A | 11/1998 | Englisch et al. | 257/347 |
| 2004/0229444 A1* | 11/2004 | Couillard et al. | 438/455 |
| 2006/0038228 A1* | 2/2006 | Aitken et al. | 257/347 |
| 2007/0042894 A1* | 2/2007 | Aitken et al. | 501/64 |
| 2007/0166947 A1* | 7/2007 | Gadkaree et al. | 438/404 |
| 2008/0057678 A1 | 3/2008 | Gadkaree et al. | 438/460 |
| 2010/0224954 A1* | 9/2010 | Gadkaree et al. | 257/506 |

FOREIGN PATENT DOCUMENTS

| | | |
|---|---|---|
| EP | 385753 | 9/1990 |
| JP | 2006-137631 | 1/2006 |
| WO | 2005/029576 | 3/2005 |

* cited by examiner

*Primary Examiner* — Minh-Loan T Tran
*Assistant Examiner* — Fazli Erdem
(74) *Attorney, Agent, or Firm* — Ryan T. Hardee

(57) ABSTRACT

Methods and apparatus for producing a semiconductor on insulator structure include: subjecting an implantation surface of a donor single crystal semiconductor wafer to an ion implantation process to create an exfoliation layer of the donor semiconductor wafer; bonding the implantation surface of the exfoliation layer to a glass substrate using electrolysis, wherein a liquidus viscosity of the glass substrate is about 100,000 Poise or greater.

25 Claims, 5 Drawing Sheets

FIG. 2

| Mole% | Min | Max | A | B | C | D | E | F | G | H | I | J |
|---|---|---|---|---|---|---|---|---|---|---|---|---|
| SiO2 | 67.5 | 71.4 | 69.90 | 67.51 | 69.19 | 68.96 | 71.36 | 70.94 | 71.00 | 71.13 | 69.83 | 69.96 |
| Al2O3 | 12.0 | 15.9 | 13.50 | 15.95 | 15.86 | 15.46 | 14.56 | 14.25 | 14.49 | 14.61 | 13.19 | 14.27 |
| B2O3 | 0.0 | 3.6 | 3.65 | 0.00 | 0.00 | 0.00 | 0.00 | 1.10 | 0.50 | 0.00 | 1.24 | 1.96 |
| MgO | 1.1 | 5.6 | 1.11 | 4.88 | 3.31 | 4.45 | 2.74 | 2.25 | 2.73 | 2.75 | 4.33 | 2.69 |
| CaO | 2.0 | 5.6 | 4.31 | 2.25 | 2.00 | 2.43 | 4.43 | 4.39 | 4.41 | 4.45 | 5.10 | 4.34 |
| SrO | 0.2 | 1.6 | 1.26 | 1.30 | 0.20 | 0.50 | 0.31 | 0.60 | 0.31 | 0.31 | 1.05 | 0.30 |
| BaO | 0.0 | 4.0 | 3.40 | 0.00 | 2.47 | 2.26 | 2.99 | 3.11 | 2.98 | 3.00 | 3.49 | 2.93 |
| La2O3 | 0.0 | 8.1 | 0.76 | 8.10 | 6.03 | 3.92 | 2.61 | 2.36 | 2.60 | 2.62 | 1.03 | 2.56 |
| Y2O3 | 0.0 | 2.0 | 2.00 | 0.00 | 0.94 | 1.95 | 1.00 | 1.00 | 1.00 | 1.00 | 0.40 | 0.98 |
| SnO2 | 0.0 | 0.1 | 0.05 | 0.00 | 0.00 | 0.03 | 0.00 | 0.00 | 0.00 | 0.05 | 0.10 | 0.00 |
| Sb2O3 | 0.0 | 0.5 | 0.00 | 0.00 | 0.00 | 0.00 | 0.00 | 0.00 | 0.00 | 0.00 | 0.25 | 0.00 |
| Fe2O3 | 0.0 | 0.0 | 0.02 | 0.00 | 0.00 | 0.02 | 0.00 | 0.00 | 0.00 | 0.03 | 0.00 | 0.00 |
| ZrO2 | 0.0 | 0.1 | 0.05 | 0.00 | 0.00 | 0.02 | 0.00 | 0.00 | 0.00 | 0.05 | 0.00 | 0.00 |
| Total | | | 100 | 100 | 100 | 100 | 100 | 100 | 100 | 100 | 100 | 100 |

FIG. 3

| Mole% | K | L | M | N | O | P | Q | R | S | T |
|---|---|---|---|---|---|---|---|---|---|---|
| SiO2 | 68.80 | 69.18 | 69.41 | 69.36 | 70.00 | 70.59 | 69.62 | 69.55 | 69.78 | 68.58 |
| Al2O3 | 11.96 | 12.20 | 12.45 | 12.44 | 12.86 | 12.59 | 12.49 | 12.06 | 12.07 | 12.67 |
| B2O3 | 2.00 | 2.00 | 2.00 | 1.99 | 1.75 | 1.75 | 1.94 | 1.50 | 1.25 | 2.23 |
| MgO | 5.58 | 5.42 | 5.21 | 5.21 | 4.94 | 4.83 | 4.97 | 5.33 | 5.32 | 5.25 |
| CaO | 5.58 | 5.42 | 5.21 | 5.21 | 4.94 | 4.83 | 5.21 | 5.56 | 5.58 | 5.59 |
| SrO | 1.58 | 1.53 | 1.48 | 1.48 | 1.40 | 1.38 | 1.48 | 1.51 | 1.50 | 1.50 |
| BaO | 3.99 | 3.73 | 3.73 | 3.72 | 3.53 | 3.45 | 3.71 | 3.98 | 3.99 | 3.59 |
| La2O3 | 0.00 | 0.00 | 0.00 | 0.00 | 0.00 | 0.00 | 0.00 | 0.00 | 0.00 | 0.00 |
| Y2O3 | 0.00 | 0.00 | 0.00 | 0.00 | 0.00 | 0.00 | 0.00 | 0.00 | 0.00 | 0.00 |
| SnO2 | 0.07 | 0.07 | 0.07 | 0.07 | 0.07 | 0.07 | 0.08 | 0.07 | 0.07 | 0.08 |
| Sb2O3 | 0.40 | 0.40 | 0.40 | 0.48 | 0.47 | 0.47 | 0.47 | 0.39 | 0.39 | 0.48 |
| Fe2O3 | 0.02 | 0.02 | 0.02 | 0.02 | 0.02 | 0.02 | 0.01 | 0.02 | 0.02 | 0.02 |
| ZrO2 | 0.02 | 0.02 | 0.02 | 0.02 | 0.02 | 0.02 | 0.01 | 0.03 | 0.03 | 0.01 |
| Total | 100 | 100 | 100 | 100 | 100 | 100 | 100 | 100 | 100 | 100 |

FIG. 4

| | A | B | C | D | E | F | G | H | I | J |
|---|---|---|---|---|---|---|---|---|---|---|
| Strain BBV | 745 | 770 | 787 | 781 | 783 | 768 | 775 | 785 | 753 | 754 |
| Anneal BBV | 797 | 815 | 834 | 828 | 832 | 818 | 824 | 834 | 804 | 804 |
| Soft | 1027 | 996 | | 1025 | 1044 | 1032 | 1034 | 1048 | 1024 | 1016 |
| Expansion | 37.3 | 42.5 | 42.3 | 39.7 | 38.2 | 37 | 38.6 | 37.8 | 38.2 | 38.9 |
| Density | 2.729 | 3.178 | 3.092 | 2.991 | 2.837 | | 2.824 | 2.835 | 2.72 | 2.785 |
| Young's modulus (GPa) | 83.93 | 95.01 | | | | | 87.90 | 88.19 | | 86.70 |
| Specific modulus | 30.75 | 29.89 | | | | | 31.13 | 31.11 | | 31.13 |
| T(200P) | 1605 | 1444 | 1492 | 1515 | 1598 | 1598 | 1594 | 1602 | 1623 | 1585 |
| T(liq) 24hr g.b. | 1165 | 1130 | 1115 | 1165 | 1170 | 1155 | 1150 | 1180 | 1160 | 1155 |
| Liq Viscosity (kP) | 376 | 167 | 677 | 172 | 426 | 603 | 725 | 330 | 446 | 395 |

FIG. 5

| | K | L | M | N | O | P | Q | R | S | T |
|---|---|---|---|---|---|---|---|---|---|---|
| Strain BBV | 724 | 737 | 724 | 735 | 727 | 726 | 730 | 727 | 731 | 736 |
| Anneal BBV | 777 | 782 | 778 | 781 | 782 | 780 | 782 | 781 | 784 | 781 |
| Soft | 1014.7 | 1013.2 | 1012.7 | 1012.9 | 1020 | 1015.9 | 1017 | 1015.8 | 1020 | 1013.3 |
| Expansion | 37 | 37.4 | 38.5 | 38.2 | 37.2 | 37.2 | 37 | 38.2 | 38.1 | 37 |
| Density | 2.6264 | 2.634 | 2.6356 | 2.6352 | 2.6391 | 2.638 | 2.634 | 2.6493 | 2.6521 | 2.6367 |
| Young's modulus (GPa) | | 81.32 | 81.20 | 80.95 | 80.91 | 81.13 | | | | |
| Specific modulus | | 30.87 | 30.81 | 30.72 | 30.66 | 30.76 | | | | |
| T(200P) | 1642 | 1644 | 1649 | 1652 | 1661 | 1672 | 1649 | 1655 | 1657 | 1630 |
| T(liq) 24hr g.b. | 1170 | 1170 | 1180 | 1170 | 1185 | 1215 | 1170 | 1175 | 1175 | 1180 |
| Liq Viscosity (kP) | 245 | 287 | 263 | 281 | 267 | 157 | 284 | 282 | 289 | 171 |

SUBSTRATE COMPOSITIONS AND METHODS FOR FORMING SEMICONDUCTOR ON INSULATOR DEVICES

CROSS-REFERENCE TO RELATED APPLICATIONS

This application claims the benefit of priority under 35 U.S.C. §119(e) of U.S. Provisional Application Ser. No. 61/001,180 filed on Oct. 31, 2007.

BACKGROUND

The present invention relates to the manufacture of semiconductor-on-insulator (SOI) structures using improved substrate compositions and improved processes for making the SOI structures.

Semiconductor on insulator devices are becoming more desirable as market demands continue to increase. SOI technology is becoming increasingly important for high performance thin film transistors (TFTs), solar cells, and displays, such as, active matrix displays. SOI structures may include a thin layer of semiconductor material, such as silicon, on an insulating material. The processing temperatures during SOI fabrication and during post processing (e.g., during fabrication of TFTs) may be limited by the SOI base materials, such as the substrate material.

Existing glass substrate materials for some SOI applications have a strain point of about 650° C. This strain point limits the aforementioned processing and post-processing temperatures to which the SOI structure may be subject, which may also result in undesirable characteristics in the ultimate SOI device, depending on the particular device application. One such fabrication process for an SOG (semiconductor-on-glass) device is an annealing process employed to remove hydrogen ions (or other ions, such as hydrogen plus helium ions) remaining from earlier implantation processes. A strain point of about 650° C. for ions) remaining from earlier implantation processes. A strain point of about 650° C. for the glass substrate will limit at least the speed and/or quality of the ion reduction process. In addition to strain point requirement the glass substrate must be fusion formable to be commercially viable.

Post processing, such as during the formation of TFTs may also be adversely affected by the limits on the strain point of the glass substrate. High electron mobility (for rapid switching) and significant TFT uniformity across large areas are desirable properties in a resulting SOG device (such as an active matrix LCD). Irrespective of whether the semiconductor material of the SOG is, for example, polysilicon or single crystal silicon, the processing methods require relatively high temperatures, e.g., substantially greater than 650° C., such as about 690° C. or higher. These TFT fabrication processes typically consist of successive deposition and patterning of thin films using significantly elevated temperatures. This may result in the glass substrate being heated to temperatures in excess of 650° C. or higher.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

The former two methods have not resulted in satisfactory structures in terms of cost and/or bond strength and durability. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 5,374,564 discloses a process to obtain a single crystal silicon film on a substrate using a thermal process. A silicon wafer having a planar face is subject to the following steps: (i) implantation by bombardment of a face of the silicon wafer by means of ions creating a layer of gaseous micro-bubbles defining a lower region of the silicon wafer and an upper region constituting a thin silicon film; (ii) contacting the planar face of the silicon wafer with a rigid material layer (such as an insulating oxide material); and (iii) a third stage of heat treating the assembly of the silicon wafer and the insulating material at a temperature above that at which the ion bombardment was carried out. The third stage employs temperatures sufficient to bond the thin silicon film and the insulating material together, to create a pressure effect in the micro-bubbles, and to cause a separation between the thin silicon film and the remaining mass of the silicon wafer. (Due to the high temperature steps, this process does not work with lower cost glass substrates.)

U.S. Pat. No. 7,176,528 discloses a process that produces an SiOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; (iv) cooling the structure to a common temperature; and (v) separating the glass substrate and a thin layer of silicon from the silicon wafer.

The resulting SOI structure just after exfoliation might exhibit excessive implantation damage of the silicon layer (e.g., due to the formation of an amorphized silicon layer) and residual implantation ions (such as hydrogen). A limitation on the strain point of the substrate material (in this case glass) will correspondingly limit the speed and/or quality of the ion removal process through annealing. Similarly, the strain point limitation may also limit the post-processing temperatures (e.g., during TFT fabrication), thereby impacting device performance characteristics.

Accordingly, there is a need in the art for new methods and apparatus for the manufacture of SOI structures, which permit elevated processing temperatures.

SUMMARY

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SiOG abbreviation is used to refer to semiconductor-on-glass structures in general, including, but not limited to, silicon-on-glass structures. The abbreviation SOI encompasses SiOG structures.

In accordance with one or more embodiments of the present invention, a semiconductor on insulator structure includes: a glass substrate; and a single crystal semiconductor layer bonded through electrolysis to the glass substrate, wherein a composition of the glass substrate is such that a liquidus viscosity thereof is about 100,000 Poise or greater. The 200 Poise temperature of the glass substrate may be below about 1675° C.

A strain point of the glass substrate may be greater than about 650° C., such as greater than about 690° C., or grater than about 710° C.

In accordance with one or more embodiments of the present invention, methods and apparatus of forming a semiconductor on insulator include: subjecting an implantation surface of a donor single crystal semiconductor wafer to an ion implantation process to create an exfoliation layer of the donor semiconductor wafer; bonding the implantation surface of the exfoliation layer to a glass substrate using electrolysis, wherein at least one of: a liquidus viscosity of the glass substrate is about 100,000 Poise or greater; and a strain point of the glass substrate is greater than about 650° C., greater than about 690° C., greater than about 700° C., or greater than about 710° C.

The glass may be fusion formable, and the methods and apparatus may further provide for: separating the exfoliation layer from the donor semiconductor wafer, thereby exposing a cleaved surface of the exfoliation layer; and annealing the exfoliation layer by elevating both the exfoliation layer and the glass substrate to a temperature of at least 700° C. for a period of time to reduce residual ions from the ion implantation step.

The annealing step may include elevating both the exfoliation layer and the glass substrate to a temperature of at least 850° C. for a period of time to reduce residual ions from the ion implantation step. The method may comprise a further heat treatment process including elevating both the exfoliation layer and the glass substrate to a temperature of at least 1000° C. for a period of time to crystallize the glass substrate.

A composition of the glass substrate when calculated in mole percent, and calculated from a batch on an oxide basis, is as follows: 64-72% $SiO_2$, 9-16.5% $Al_2O_3$, 0-5% $B_2O_3$, 0.5-7.5% MgO, 1-10% CaO, 0-4.5% SrO, 0-7% BaO, and 0-9% ($La_2O_3+Y_2O_3+Re_2O_3$). The sum of MgO, CaO, SrO, BaO, and $3La_2O_3$ divided by $Al_2O_3$ in mole percentages may be greater than or equal to about 1.10. Alternatively or additionally, $(RO+1.5*RE_2O_3)/Al_2O_3$ may be between about 0.85 and 1.2. The Re is a rare earth selected from group consisting of Sc, Ce, Pr, Nd, Sm, Eu, Gd, Tb, Dy, Ho, Er, Tm, Yb, Lu and mixtures thereof.

The composition of the glass substrate may alternatively or additionally include up to 15%, when calculated in mole percent and calculated from the batch on an oxide basis, of at least one modifying oxide selected from the group consisting of MgO, CaO, SrO, BaO, $B_2O_3$, $Ta_2O_5$, $TiO_2$, $ZrO_2$, $HfO_2$, $SnO_2$, $P_2O_5$, ZnO, $Sb_2O_3$, $As_2O_3$, $SnO_2$ in a total amount not exceeding 20 mole percent.

The single crystal semiconductor layer is taken from the group consisting of: silicon (Si), germanium-doped silicon (SiGe), silicon carbide (SiC), germanium (Ge), gallium arsenide (GaAs), GaP, and InP.

The glass substrate includes, in order, a bulk layer, an enhanced positive ion concentration layer, a reduced positive ion concentration layer, where the enhanced positive ion concentration layer contains substantially all modifier positive ions from the reduced positive ion concentration layer as a result of migration; and a conductive or semiconductive oxide layer is located between the reduced positive ion concentration layer of the substrate and the single crystal semiconductor layer.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

FIGS. 2, 3, 4, and 5 illustrate tabular data defining the composition for, and the properties of, a number of glass substrates suitable for use in implementing the SOI of FIG. 1;

DETAILED DESCRIPTION

Figure 1:
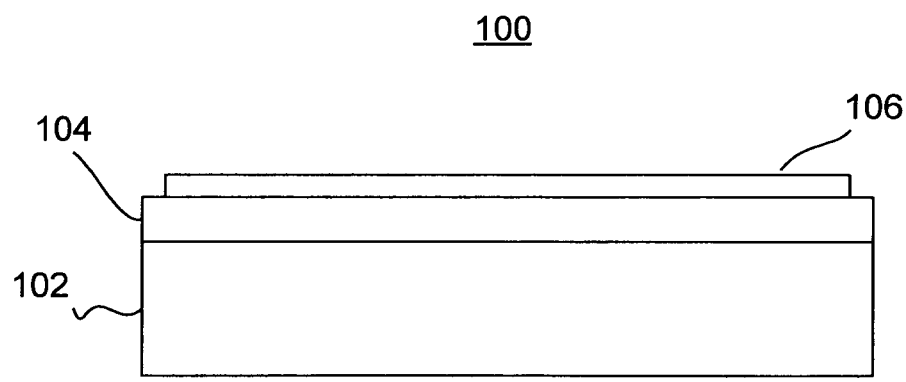
FIG. 1 is a block diagram illustrating an SOI device in accordance with one or more embodiments of the present invention.

With reference to the drawings, wherein like numerals indicate like elements, there is shown in FIG. 1 a semiconductor on insulator device 100 in accordance with one or more embodiments of the present invention. The SOI device includes a glass substrate 102, a semiconductor layer 104, and one or more further device layers 106. By way of example, the one or more further device layers 106 may define one or more thin film transistors, TFTs and/or other electronic devices. The SOI device 100 has application for use in displays, including organic light-emitting diode (OLED) displays and liquid crystal displays (LCDs), integrated circuits, photovoltaic devices, etc.

As will be discussed in more detail later in this description, the glass substrate 102 exhibits desirable thermal characteristics, such as high strain point, high liquidus viscosity, and/or low 200 Poise temperature, which may contribute to improving the manufacturing process and/or the resulting performance characteristics of the SOI device 100. Additionally, the glass substrate 102 may exhibit desirable physical properties, such as a substantially smooth and uniform as-drawn surface (the surface existing after drawing a glass sheet without post processing to improve the uniformity of the glass surface). A desirable as-drawn surface may be obtained by using fusion formable glass compositions as will be discussed in more detail below.

The semiconductor material of the layer 104 may be in the form of a substantially single-crystal material. The term "substantially" is used in describing the layer 104 to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The glass substrate 102 may have a thickness in the range of about 0.1 mm to about 10 mm, such as in the range of about 0.5 mm to about 3 mm. For some SOG structures, insulating layers having a thickness greater than or equal to about 1 micron are desirable, e.g., to avoid parasitic capacitive effects which arise when standard SOG structures having a silicon/silicon dioxide/silicon configuration are operated at high frequencies. In general, the glass substrate 102 should be thick enough to support the semiconductor layer 104 through the bonding process steps, as well as subsequent processing performed on the intermediate structures to produce the SOI 100. Although there is no theoretical upper limit on the thickness of the glass substrate 102, a thickness beyond that needed for the support function or that desired for the ultimate SOI device 100 might not be advantageous since the greater the thickness of the glass substrate 102, the more difficult it may be to accomplish at least some of the process steps in forming the SOI 100.

The glass substrate 102 may be formed from an oxide glass. The strain point of the glass substrate 102 is desirably greater than about 650° C., such as greater than about 690° C., and/or greater than bout 700° C. or 710° C. The glass substrate 102 may alternatively or additionally have a liquidus viscosity of greater than about 100,000 Poise. The strain point of the glass substrate 102 may be increased by lowering the modifier content of the glass and increasing the silica content, but this also raises the temperature required to melt and fine glass substrate 102 to a high quality melt. This temperature is often referred to as the 200 Poise temperature. Thus generally, the higher the strain point, the higher the 200 Poise temperature, which accelerates corrosion of the refractory, increases energy consumption, and the overall cost. Thus, there is a tradeoff between strain point and meltability of the glass substrate 102. The 200 Poise temperature of the glass substrate 102 is preferably below about 1675° C.

The oxide glass substrate 102 may be silica-based. In order to achieve one or more of the aforementioned strain point, liquidus viscosity, and/or 200 Poise temperature, the composition of the glass substrate 102 may be adjusted.

Reference is now made to FIGS. 2-3, which illustrate the composition of a number of glass substrates 102, namely GLASS A-GLASS T. The composition of the glass substrate 102 when calculated in mole percent, and calculated from a batch on an oxide basis, may be as follows: 64-72% $SiO_2$, 9-16.5% $Al_2O_3$, 0-5% $B_2O_3$, 0.5-7.5% MgO, 1-10% CaO, 0-4.5% SrO, 0-7% BaO, and 0-9% ($La_2O_3+Y_2O_3+Re_2O_3$). The Re is a rare earth selected from group consisting of Sc, Ce, Pr, Nd, Sm, Eu, Gd, Tb, Dy, Ho, Er, Tm, Yb, Lu and mixtures thereof.

$SiO_2$ serves as a network-forming component of the glass substrate 102. When the $SiO_2$ content falls below about 60 mole percent, chemical resistance may be adversely affected and the strain point may be lowered. When the $SiO_2$ level surpasses about 85%, the liquidus and melting temperatures may approach or exceed desirable levels and adversely impact the results of manufacturing sheet glass.

The $Al_2O_3$ glass component serves to further stabilize the glass network, especially in the presence of network-modifying components, enhancing heat and devitrification resistance of the glass substrate 102. When the level of $Al_2O_3$ drops below about 10 mole percent, devitrification readily occurs. If the glass substrate 102 contains greater than 25 mole percent $Al_2O_3$, the liquidus temperature exceeds 1300° C. and the glass becomes subject to acid degradation.

The $RE_2O_3$ glass component maintains the high strain point of the base aluminosilicate glass while reducing the liquidus and 200 Poise temperatures. If the glass substrate 102 contains less than about four mole percent $RE_2O_3$, the material becomes too refractory for conventional melting and forming practices for high strain point compositions. Too much $RE_2O_3$ could decrease the strain point and raise the CTE. It is desirable to have the CTE less than of equal to about 42 ppm. As a general rule, the total amount of modifying oxides (including preferably $La_2O_3$) should not exceed the amount of alumina in order to maintain the structural integrity of the glass network and, hence, the desired high strain point. The best properties (low CTE and liquidus temperature) are usually obtained when the modifier to alumina ratio given by $(RO+1.5*RE_2O_3)/Al_2O_3$ is close to 1 and between 0.85 and 1.2, depending on the makeup of the alkaline earth oxides. Using the compositions in FIGS. 2-4, the sum of MgO, CaO, SrO, BaO, and $3La_2O_3$ divided by $Al_2O_3$ in mole percentages may be greater than or equal to about 1.10.

Any number of fluxes (e.g. modifying oxides) may be added to the glass batch in order to impart desired characteristics. While these fluxes may lower the strain point of the native glass, they are often useful for any or all of the following purposes: raising the CTE, lowering the liquidus temperature, obtaining a preferred strain point for compaction, absorption at specific wavelengths, facilitating melting, modifying density, or modifying durability. The effects that certain oxides have on the physical and chemical characteristics of glass are generally known. For example, $B_2O_3$ is a component that serves to lower viscosity and facilitate melting. The addition of MgO and/or CaO is known to decrease liquidus temperature without significantly lowering strain point when balanced by an equivalent $Al_2O_3$ addition. Likewise BaO and/or SrO are also valuable for lowering the liquidus temperature and are known to improve the chemical resistance of glass and improve resistance to devitrification—but tend to increase the CTE faster than MgO or CaO. ZnO is known to enhance resistance to buffered hydrofluoric acid as well as resistance to devitrification. $As_2O_3$, $Sb_2O_5$, $CeO_2$, $SO_3$, $SnO_2$, halides and other known fining agents may be added to the batch to reduce bubbles in the glass.

Fluxes in the form of modifying oxides, represented by RO may be added in amounts up to 20% or as limited by solubility. Preferably fluxes are added in amounts less than 15 mole percent. Modifying oxides may be selected from those of alkali metals, alkaline earth metals, transition metals as well as oxides of the lanthanide series. Specific examples include, $ZrO_2$, $HfO_2$, MgO, CaO, SrO, BaO, $As_2O_3$, $SnO_2$, $Li_2O$, $GeO_2$, $Ga_2O_3$, $Sb_2O_3$, $P_2O_5$ and/or $B_2O_3$. For preferred embodiments, R may be the alkaline earth elements Mg, Ca, Sr, or Ba.

It is noted that for glasses used for flat panel display devices, modifying oxides are preferred. However, modifying with nitrides such as AlN, or modifying with halogens such as $F^-$, alone or in combination with modifying oxides may be acceptable for particular applications. In such cases, the total modifier content should still not exceed 20 mole percent and preferably should be less than 15 mole percent. Likewise, although it is preferred that glasses used as substrates for LCD displays be alkali-free, such constraints may not be desirable for other applications.

With reference to FIGS. 4-5 a number of other characteristics of the glass substrates 102, expressed in GLASS A-GLASS T are illustrated. Non-silica-based glasses may be used in the practice of one or more embodiments of the invention, but are generally less advantageous because of their higher cost and/or inferior performance characteristics. Similarly, for some applications, e.g., for TFTs using SOG structures employing semiconductor materials that are not silicon-based, glass substrates which are not oxide based, e.g., non-oxide glasses, may be desirable, but are generally not advantageous because of their higher cost.

As will be discussed in more detail below, in one or more embodiments, the glass substrate 102 is designed to match a coefficient of thermal expansion (CTE) of one or more semiconductor materials (e.g., silicon, germanium, etc.) of the layer 104 that are bonded thereto. The CTE match ensures desirable mechanical properties during heating cycles of the deposition process.

For certain applications, e.g., display applications, the glass substrate 102 may be transparent in the visible, near UV, and/or IR wavelength ranges, e.g., the glass 102 may be transparent in the 350 nm to 2 micron wavelength range.

Figure 6:
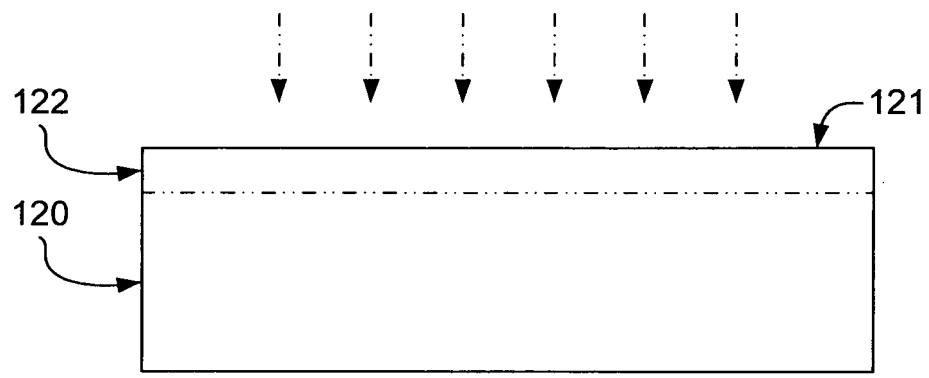
FIGS. 6, 7, and 8 are block diagrams illustrating intermediate structures formed using processes of the present invention to produce a base SOI structure on which the SOI device of FIG. 1 may be formed.

Reference is now made to FIGS. 6-10, which illustrate intermediate structures that may be formed, and processes that may be carried out, in order to produce a base SOG structure 101 (FIG. 10) from which the SOI device 100 may be formed. Turning first to FIG. 6, an implantation surface 121 of a donor semiconductor wafer 120 is prepared, such as by polishing, cleaning, etc. to produce a relatively flat and uniform implantation surface 121 suitable for bonding to the glass substrate 102. For the purposes of discussion, the semiconductor wafer 120 may be a substantially single crystal silicon wafer, although as discussed above any other suitable semiconductor conductor material may be employed.

An exfoliation layer 122 is created by subjecting the implantation surface 121 to one or more ion implantation processes to create a weakened region below the implantation surface 121 of the donor semiconductor wafer 120. Although the embodiments of the present invention are not limited to any particular method of forming the exfoliation layer 122, one suitable method dictates that the implantation surface 121 of the donor semiconductor wafer 120 may be subject to a hydrogen ion implantation process to at least initiate the creation of the exfoliation layer 122 in the donor semiconductor wafer 120. The implantation energy may be adjusted using conventional techniques to achieve a general thickness of the exfoliation layer 122, such as between about 300-500 nm. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 122 may be employed without departing from the spirit and scope of the present invention.

The donor semiconductor wafer 120 may be treated to reduce, for example, the hydrogen ion concentration on the implantation surface 121. For example, the donor semiconductor wafer 120 may be washed and cleaned and the implantation donor surface 121 of the exfoliation layer 122 may be subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen terminated surface groups oxidize to hydroxyl groups, which in turn also makes the surface of the silicon wafer hydrophilic. The treatment may be carried out at room temperature for the oxygen plasma and at temperature between 25-150° C. for the ammonia or acid treatments.

Figure 7:
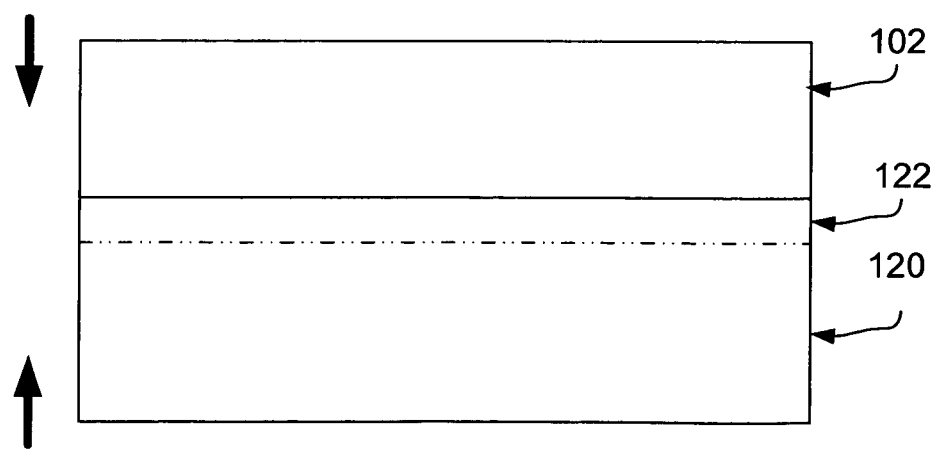
Figure 8:
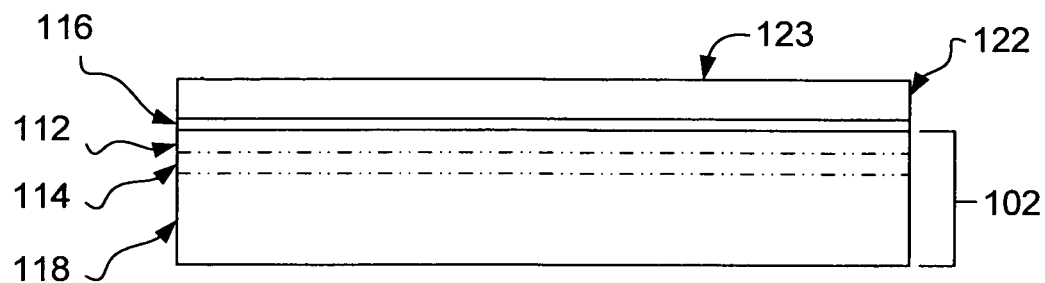

With reference to FIGS. 7-8 the glass substrate 102 may be bonded to the exfoliation layer 122 using an electrolysis process. A suitable electrolysis bonding process is described in U.S. Pat. No. 7,176,528, the entire disclosure of which is hereby incorporated by reference. Portions of this process are discussed below. In the bonding process, appropriate surface cleaning of the glass substrate 102 (and the exfoliation layer 122 if not done already) may be carried out. In one or more embodiments, the glass substrate includes an as-drawn surface to which the exfoliation layer 122 is bonded. It has been discovered that the compositions of glass illustrated in FIGS. 2-4 and discussed above have desirable fusion formable properties and may produce an as-drawn surface suitable for bonding without having significant (or any) post processing to improve surface roughness, surface smoothness, surface uniformity, etc.

Thereafter, the intermediate structures are brought into direct or indirect contact to achieve the arrangement schematically illustrated in FIG. 7. Prior to or after the contact, the structure(s) comprising the donor semiconductor wafer 120, the exfoliation layer 122, and the glass substrate 102 are heated under a differential temperature gradient. The glass substrate 102 may be heated to a higher temperature than the donor semiconductor wafer 120 and exfoliation layer 122. By way of example, the temperature difference between the glass substrate 102 and the donor semiconductor wafer 120 (and the exfoliation later 122) is at least 1 degree C., although the difference may be as high as about 100 to about 150 degrees C. This temperature differential is desirable for a glass having a coefficient of thermal expansion (CTE) matched to that of the donor semiconductor wafer 120 (such as matched to the CTE of silicon) since it facilitates later separation of the exfoliation layer 122 from the semiconductor wafer 120 due to thermal stresses.

Once the temperature differential between the glass substrate 102 and the donor semiconductor wafer 120 is stabilized, mechanical pressure is applied to the intermediate assembly. The pressure range may be between about 1 to about 50 psi. Application of higher pressures, e.g., pressures above 100 psi, might cause breakage of the glass substrate 102.

The glass substrate 102 and the donor semiconductor wafer 120 may be taken to a temperature within about +/−150 degrees C. of the strain point of the glass substrate 102, which is preferably greater than about 700° C.

Next, a voltage is applied across the intermediate assembly, for example with the donor semiconductor wafer 120 at the positive electrode and the glass substrate 102 the negative electrode. The intermediate assembly is held under the above conditions for some time (e.g., approximately 1 hour or less), the voltage is removed and the intermediate assembly is allowed to cool to room temperature.

With reference to FIG. 8, at some point during the above process, the donor semiconductor wafer 120 and the glass substrate 102 are separated, which may include some peeling if they have not already become completely free, to obtain a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

The separation of the donor semiconductor wafer 120 from the exfoliation layer 122 that is bonded to the glass substrate 102 is accomplished through application of stress to the zone of weakness within the donor semiconductor wafer, such as by a heating and/or cooling process. It is noted that the characteristics of the heating and/or cooling process may be established as a function of a strain point of the glass substrate 102. Although the invention is not limited by any particular theory of operation, it is believed that glass substrates 102 with relatively low strain points may facilitate separation when the respective temperatures of the donor semiconductor wafer and the glass substrate 102 are falling or have fallen during cooling. Similarly, it is believed that glass substrates 102 with relatively high strain points may facilitate separation when the respective temperatures of the donor semiconductor wafer 120 and the glass substrate 102 are rising or have risen during heating. Separation of the donor semiconductor wafer 120 and the glass substrate 102 may also occur when the respective temperatures thereof are neither substantially rising nor falling (e.g., at some steady state or dwell situation).

The application of the voltage potential causes alkali or alkaline earth ions in the glass substrate 102 to move away from the semiconductor/glass interface further into the glass substrate 102. More particularly, positive ions of the glass substrate 102, including substantially all modifier positive ions, migrate away from the higher voltage potential of the semiconductor/glass interface, forming: (1) a reduced positive ion concentration layer 112 in the glass substrate 102 adjacent the semiconductor/glass interface; and (2) an enhanced positive ion concentration layer 112 of the glass substrate 102 adjacent the reduced positive ion concentration layer 112. This accomplishes a number of functions: (i) an alkali or alkaline earth ion free interface (or layer) 112 is created in the glass substrate 102; (ii) an alkali or alkaline earth ion enhanced interface (or layer) 112 is created in the glass substrate 102; (iii) an oxide layer 116 is created between the exfoliation layer 122 and the glass substrate 102; and (iv) the glass substrate 102 becomes very reactive and bonds to the exfoliation layer 122 strongly with the application of heat at relatively low temperatures.

In the example illustrated in FIG. 8, the intermediate structure resulting from the electrolysis process includes, in order: a bulk glass substrate 118 (in the glass substrate 102); the enhanced alkali or alkaline earth ion layer 114 (in the glass substrate 102); the reduced alkali or alkaline earth ion layer 112 (in the glass substrate 102); the oxide layer 116; and the exfoliation layer 122.

After separation, the basic resulting structure of FIG. 8 includes the glass substrate 102 and the exfoliation layer 122 of semiconductor material bonded thereto. The cleaved surface 123 of the SOI structure just after exfoliation and the exfoliation layer 122 in general may exhibit excessive concentrations of ions remaining from the ion implantation step (FIG. 6), and other implantation damage of the silicon layer (e.g., due to the formation of an amorphized silicon layer). In some cases, the amorphized silicon layer may be on the order of about 50-150 nm in thickness.

Figure 9:
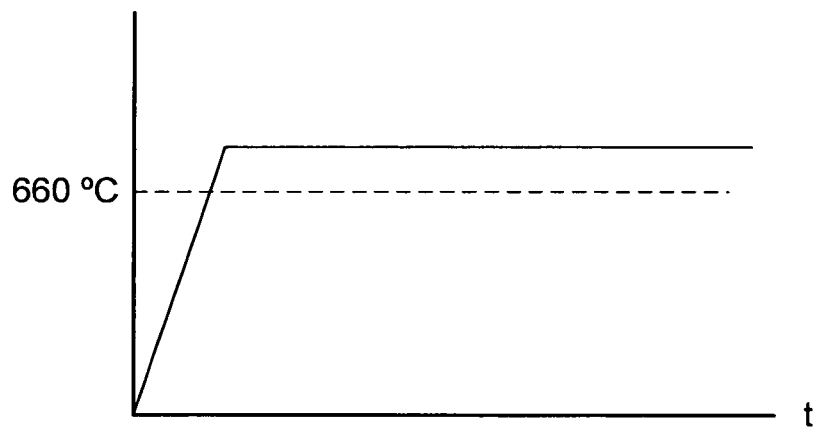
FIG. 9 is a graph illustrating a heat treatment process that may be performed to reduce ion impurities in a semiconductor layer of the intermediate structure of FIG. 8.

Accordingly, with reference to FIG. 9, the exfoliation layer 122 may be annealed by elevating both the exfoliation layer 122 and the glass substrate 102 to a temperature of at least 700° C. (well above 660° C. of existing processes) for a period of time to reduce residual ions from the ion implantation step. The annealing step may include elevating the exfoliation layer 122 and the glass substrate 102 to a temperature of at least 850° C. A further heat treatment process may include elevating the exfoliation layer 122 and the glass substrate 102 to a temperature of at least 1000° C. for a period of time to crystallize the glass substrate 102.

Figure 10:
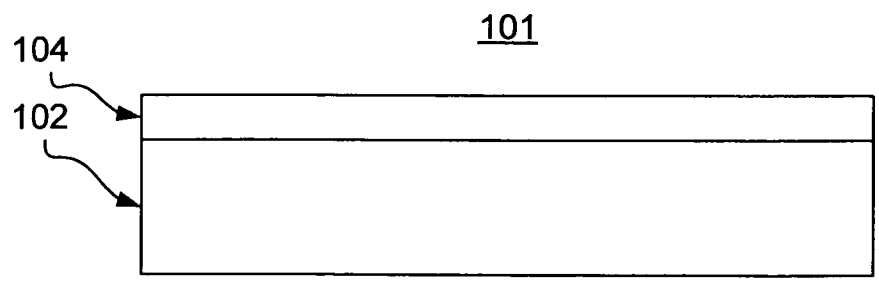
FIG. 10 is a block diagram illustrating a further intermediate structure formed using processes of the present invention to produce the base SOI structure on which the SOI device of FIG. 1 may be formed.

With reference to FIG. 10, the process may additionally or alternatively include subjecting the surface 123 of the semiconductor layer 104 to polishing and/or other finishing steps. The intent of the polishing step is to remove additional material from the semiconductor layer 104 by polishing the surface 123 down to a polished surface. The polishing step may include using polishing (or buffing) equipment to buff the surface 123 using a silica based slurry or similar material known in the art in the semiconductor industry. This polishing process may be a deterministic polishing technique as known in the art. Following the polishing step, the remaining semiconductor layer 104 may be substantially thinner and/or smoother than would otherwise be obtained by etching alone.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:
1. A semiconductor on insulator structure, comprising:
a glass substrate; and
a single crystal semiconductor layer bonded through electrolysis to the glass substrate, wherein a composition of the glass substrate is such that a liquidus viscosity thereof is about 100,000 Poise or greater;
wherein the glass composition, when calculated in mole percent, and calculated from a batch on an oxide basis, is as follows: 64-72% $SiO_2$, 9-16.5% $Al_2O_3$, 0-5% $B_2O_3$, 0.5-7.5% MgO, 1-10% CaO, 0-4.5% SrO, 0-7% BaO, and 0-9% ($La_2O_3+Y_2O_3+RE_2O_3$); and
wherein RE is a rare earth element, and a sum of MgO, CaO, SrO, BaO, and $3La_2O_3$ divided by $Al_2O_3$ in mole percentages is greater than or equal to about 1.10.

2. The semiconductor on insulator structure of claim 1, wherein a strain point of the glass substrate is greater than about 650° C.

3. The semiconductor on insulator structure of claim 1, wherein a strain point of the glass substrate is greater than about 690° C.

4. The semiconductor on insulator structure of claim 1, wherein a strain point of the glass substrate is greater than about 710° C.

5. The semiconductor on insulator structure of claim 1, wherein the 200 Poise temperature of the glass substrate is below about 1675° C.

6. A semiconductor on insulator structure, comprising:
a glass substrate; and
a single crystal semiconductor layer bonded through electrolysis to the glass substrate, wherein a composition of the glass substrate is such that a liquidus viscosity thereof is about 100,000 Poise or greater;
wherein the glass composition, when calculated in mole percent, and calculated from a batch on an oxide basis, is as follows: 64-72% $SiO_2$, 9-16.5% $Al_2O_3$, 0-5% $B_2O_3$, 0.5-7.5% MgO, 1-10% CaO, 0-4.5% SrO, 0-7% BaO, and 0-9% ($La_2O_3+Y_2O_3+Re_2O_3$), where RE is a rare earth element; and
wherein $(RO+1.5*RE_2O_3)/Al_2O_3$ is between about 0.85 and 1.2.

7. The semiconductor on insulator structure of claim 1, wherein the Re is a rare earth selected from group consisting of Sc, Ce, Pr, Nd, Sm, Eu, Gd, Tb, Dy, Ho, Er, Tm, Yb, Lu and mixtures thereof.

8. The semiconductor on insulator structure of claim 1, wherein a composition of the glass substrate includes up to 15%, when calculated in mole percent and calculated from the batch on an oxide basis, of at least one modifying oxide selected from the group consisting of MgO, CaO, SrO, BaO, $B_2O_3$, $Ta_2O_5$, $TiO_2$, $ZrO_2$, $HfO_2$, $SnO_2$, $P_2O_5$, ZnO, $Sb_2O_3$, $As_2O_3$, $SnO_2$ in a total amount not exceeding 20 mole percent.

9. The semiconductor on insulator structure of claim 1, wherein the single crystal semiconductor layer is taken from the group consisting of: silicon (Si), germanium-doped silicon (SiGe), silicon carbide (SiC), germanium (Ge), gallium arsenide (GaAs), GaP, and InP.

10. The semiconductor on insulator structure of claim 1, wherein:
the glass substrate includes, in order, a bulk layer, an enhanced positive ion concentration layer, a reduced positive ion concentration layer, where the enhanced positive ion concentration layer contains substantially all modifier positive ions from the reduced positive ion concentration layer as a result of migration; and
a conductive or semiconductive oxide layer is located between the reduced positive ion concentration layer of the substrate and the single crystal semiconductor layer.

11. The semiconductor on insulator structure of claim 1, wherein the single crystal semiconductor layer is bonded through electrolysis to an as-drawn surface of the glass substrate.

12. A method of forming a semiconductor on insulator structure, comprising:
subjecting an implantation surface of a donor single crystal semiconductor wafer to an ion implantation process to create an exfoliation layer of the donor semiconductor wafer; and
bonding the implantation surface of the exfoliation layer to a glass substrate using electrolysis, wherein a liquidus viscosity of the glass substrate is about 100,000 Poise or greater;
wherein a composition of the glass substrate when calculated in mole percent, and calculated from a batch on an oxide basis, is as follows: 64-72% $SiO_2$, 9-16.5% $Al_2O_3$, 0-5% $B_2O_3$, 0.5-7.5% MgO, 1-10% CaO, 0-4.5% SrO, 0-7% BaO, and 0-9% ($La_2O_3+Y_2O_3+RE_2O_3$), where RE is a rare earth element; and
wherein a sum of MgO, CaO, SrO, BaO and $3La_2O_3$ divided by Al2O3 in mole percentages is greater than or equal to about 1.10.

13. The method of claim 12, further comprising:
separating the exfoliation layer from the donor semiconductor wafer, thereby exposing a cleaved surface of the exfoliation layer; and
annealing the exfoliation layer by elevating both the exfoliation layer and the glass substrate to a temperature of at least 700° C. for a period of time to reduce residual ions from the ion implantation step.

14. The method of claim 13, wherein the annealing step includes elevating both the exfoliation layer and the glass substrate to a temperature of at least 850° C. for a period of time to reduce residual ions from the ion implantation step.

15. The method of claim 13, further comprising a further heat treatment process including elevating both the exfoliation layer and the glass substrate to a temperature of at least 1000° C. for a period of time to crystallize the glass substrate.

16. A method of forming a semiconductor on insulator structure, comprising:
subjecting an implantation surface of a donor single crystal semiconductor wafer to an ion implantation process to create an exfoliation layer of the donor semiconductor wafer; and
bonding the implantation surface of the exfoliation layer to a glass substrate using electrolysis, wherein a liquidus viscosity of the glass substrate is about 100,000 Poise or greater;
wherein a composition of the glass substrate when calculated in mole percent, and calculated from a batch on an oxide basis, is as follows: 64-72% $SiO_2$, 9-16.5% $Al_2O_3$, 0-5% $B_2O_3$, 0.5-7.5% MgO, 1-10% CaO, 0-4.5% SrO, 0-7% BaO, and 0-9% ($La_2O_3+Y_2O_3+RE_2O_3$), where RE is a rare earth element; and
wherein $(RO+1.5*RE_2O_3)/Al_2O_3$ is between about 0.85 and 1.2.

17. The method of claim 12, wherein the Re is a rare earth selected from group consisting of Sc, Ce, Pr, Nd, Sm, Eu, Gd, Tb, Dy, Ho, Er, Tm, Yb, Lu and mixtures thereof.

18. The method of claim 12, wherein the strain point of the glass substrate is greater than about 650° C.

19. The method of claim 12, wherein a strain point of the glass substrate is greater than about 690° C.

20. The method of claim 12, wherein a strain point of the glass substrate is greater than about 710° C.

21. The method of claim 12, wherein the 200 Poise temperature of the glass substrate is below about 1675° C.

22. The method of claim 12, wherein the step of bonding includes:
heating at least one of the glass substrate and the donor semiconductor wafer;
bringing the glass substrate into direct or indirect contact with the donor semiconductor wafer through the exfoliation layer; and
applying a voltage potential across the glass substrate and the donor semiconductor wafer to induce the bond.

23. The method of claim 22, further comprising maintaining the contact, heat, and voltage such that: (i) an oxide layer forms on the substrate between the donor semiconductor wafer and the substrate; and (ii) positive ions of the substrate, including substantially all modifier positive ions, migrate away from the higher voltage potential of the donor semiconductor wafer, forming: (1) a reduced positive ion concentration layer in the substrate adjacent the donor semiconductor wafer; and (2) an enhanced positive ion concentration layer of the substrate adjacent the reduced positive ion concentration layer.

24. The method of claim 12, wherein the step of bonding includes bonding the implantation surface of the exfoliation layer to an as-drawn surface of the glass substrate.

25. The method of claim 12, wherein the donor semiconductor wafer is taken from the group consisting of: silicon (Si), germanium-doped silicon (SiGe), silicon carbide (SiC), germanium (Ge), gallium arsenide (GaAs), GaP, and InP.

* * * * *